United States Patent [19]

Matsuda et al.

[11] Patent Number: 5,356,755
[45] Date of Patent: Oct. 18, 1994

[54] METHOD FOR PRODUCING PRINTED CIRCUIT BOARD USING PHOTOCURABLE RESIN LAMINATE

[75] Inventors: Hideki Matsuda; Jiro Sato; Toru Mori, all of Fuji, Japan

[73] Assignee: Asahi Kasei Kogyo Kabushiki Kaisha, Osaka, Japan

[21] Appl. No.: 46,368

[22] Filed: Apr. 13, 1993

Related U.S. Application Data

[63] Continuation of Ser. No. 555,484, Aug. 16, 1990, abandoned.

[30] Foreign Application Priority Data

May 17, 1989 [JP] Japan .................. 1-121325
Sep. 18, 1989 [JP] Japan .................. 1-240262
Nov. 27, 1989 [JP] Japan .................. 1-304878

[51] Int. Cl.⁵ .................. H05K 3/42; G03F 7/038
[52] U.S. Cl. .................. 430/313; 430/318; 430/319; 427/97; 156/630; 156/634; 156/901
[58] Field of Search .............. 430/313, 318, 319, 281; 427/96, 97; 156/630, 634, 901

[56] References Cited

U.S. PATENT DOCUMENTS 4,360,582 11/1982 Taguchi et al. .................. 430/260
4,705,740 11/1987 Geissler et al. .................. 430/288

FOREIGN PATENT DOCUMENTS 0046271 2/1982 European Pat. Off. .
0127762 12/1984 European Pat. Off. .
2062545 3/1990 Japan .
1344726 1/1974 United Kingdom .
1418169 12/1975 United Kingdom .
1507774 4/1978 United Kingdom .

OTHER PUBLICATIONS

Acheson et al., 1954, *J. Chem. Soc.*, 4142 (1954).
J6 3080-594A, Abstract, Printing:Coating:Photographic Chemistry, Week 8820, pp. 21–22.
JP 63-132233(A), S. Yanagiura, vol. 12, No. 390, (p. 772) (3237), Oct. 18, 1988, Abstract.

*Primary Examiner*—Marion E. McCamish
*Assistant Examiner*—Rosemary Ashton
*Attorney, Agent, or Firm*—Birch, Stewart, Kolasch & Birch

[57] ABSTRACT

Method for producing printed circuit board using a photocurable resin laminate comprising a support and a photocurable resin layer disposed on one surface of said support, said photocurable resin layer having:
(a) a viscosity of from $10^4$ to $5\times10^5$ poises as measured at 90° C.;
(b) a thickness of from 30 to 150 $\mu$m; and
(c) an ultraviolet ray transmittance of from 40 to 95% with respect to ultraviolet rays having a wavelength of 365 nm.

When this photocurable resin laminate is laminated under pressure on both surfaces of a metal-clad insulting base board having through-holes of an inner diameter smaller than 0.5 mm so that both surfaces of the metal-clad insulating base board are covered with the photocurable layer of the photocurable resin laminate, the photocurable resin layer intrudes locally in the inner side of the inner circumferential edge of both terminal openings of each through-hole and extends from the inner circumferential edge along and on the inner wall of the through-hole to a predetermined depth. By the light exposure of such a laminate structure and the subsequent development, both terminal openings of each through-hole can be completely covered with a photocured resin layer without occurrence of coverage failure, wherein a photocured resin layer adhering to the inner wall of the through-hole is formed in the through-hole from the inner circumferential edge of the terminal opening thereof along and on the inner wall of the through-hole.

6 Claims, 1 Drawing Sheet

METHOD FOR PRODUCING PRINTED CIRCUIT BOARD USING PHOTOCURABLE RESIN LAMINATE

This application is a continuation, of application Ser. No. 07/555,484 filed on Aug. 16, 1990, now abandoned.

TECHNICAL FIELD

The present invention relates to a photocurable resin laminate. More particularly, the present invention relates to a novel photocurable resin laminate suitable for the production of a printed circuit board having through-holes of a small diameter, and also relates to a method for producing a printed circuit board by using this laminate.

BACKGROUND ART

In conventional printed circuit boards, through-holes serve not only for maintaining electric conduction between printed patterns on both sides of the board, but also for fixing electric and/or electronic elements to the board, in which pins of the elements are inserted into these through-holes and connected to the through-holes by soldering. Accordingly, these through-holes generally have a diameter as large as several millimeters (2 to 6 mm), and the width of a conductor layer portion formed around each of the through-holes on the surface of the board (which conductive layer portion is hereinafter referred to as "land") is usually about 0.5 mm. As a method for producing a printed circuit board having such through-holes, the so-called tenting method using a photocurable resin laminate is known (see Japanese Patent Publication No. 46-3746), and this method has been widely practiced. According to the tenting method, a printed circuit board is produced by laminating a photocurable resin laminate (comprising a support and a photocurable resin layer disposed on one surface of the support) on both surfaces of a metal-clad insulating base board having metallic conductive layers on not only both surfaces thereof but also the entire inner walls of through-holes thereof, so that both surfaces of the metal-clad insulating base board, which are inclusive of both terminal openings of each through-hole, are covered with one surface of the photocurable resin layer remote from the support, exposing the photocurable resin layer on each surface of the metal-clad insulating base board to ultraviolet radiation through a predetermined transmitting pattern to form a photocured resin latent image covering the terminal opening of each through-hole, subjecting the exposed resin layer to development with a liquid developer to form an image of the photocured resin, and etching the metallic conductive layer on each surface of the metal-clad insulating base board in areas other than the image of the photocured resin as an etching resist. The etching resist pattern formed to cover the terminal opening of the through-hole is secured by adhesion to the surface of the land formed around the through-hole, so that the etching solution is prevented from intruding into the through-hole.

Recently, the mounting-on-surface method has been widely adopted as a production technique suitable for increasing the density in printed circuit boards. According to this mounting-on-surface method, an electric and/or electronic element to be mounted on a board is fixed, by soldering, to a conductive layer on the surface of the board. In this case, through-holes are only required to serve as a conductor for producing electric conduction between the circuits on both sides of the board, obviating insertion of pins of elements and, therefore, it has become possible to design a high density printed circuit board having through-holes of a diameter smaller than in the conventional printed circuit boards.

The through-holes having a small diameter are called small-diameter through-holes (or minivia through-holes). The diameter of the small-diameter through-holes is generally not greater than 0.5 mm, and the land width is generally not greater than 100 μm, preferably not greater than 50 μm.

When production of a printed circuit board having small-diameter through-holes is tried by the conventional tenting method, permeation of an etching solution into the small-diameter through-holes is likely to occur, so that it is practically impossible to produce a printed circuit board. In the practical production line, by the thermal expansion and contraction of a negative mask used in the light exposure of the photocurable resin layer and/or by the occurrence of relative dislocation between both the opposite terminal openings of each through-hole which is caused by the formation of bent through-holes due to the vibration of a drill which occurs when through-holes are formed in the insulating base board by drilling, large positional disagreement is caused between the land patterns on the negative mask and the through-holes on the base board, such that the magnitude of this disagreement is larger than the land width. This large positional disagreement causes the outer circumferential edge of the through-hole to partially lack a land, so that the resist pattern is missing in this land-lacking portion, causing permeation of an etching solution into the small-diameter through-hole.

In order to prevent the etching solution from permeating into the small-diameter through-holes, the so-called plugging process has been widely adopted in which a resin called a plugging ink is filled in through-holes and then, a photocurable resin laminate is laminated on a base board.

However, the plugging process is disadvantageous in that since not only is a step of filling the plugging ink, but also a step of removing the plugging ink after the etching operation, is required to be added to the conventional tenting method, and thus, the productivity is drastically reduced.

In these situations, development of a photocurable resin laminate suitable for producing a printed circuit board having small-diameter through-holes, without suffering from permeation of an etching solution into the small-diameter through-holes during the etching step, with very high reliability of conduction of through-holes, and development of a method for producing a printed circuit board by using this photocurable resin laminate, have been strongly desired in the art.

It is therefore an object of the present invention to provide a novel photocurable resin laminate suitable for the production of a printed circuit board having small-diameter through-holes.

Another object of the present invention is to provide a method for producing a printed circuit board having small-diameter through-holes by using this novel photocurable resin laminate.

The foregoing and other objects, features and advantages of the present invention will become apparent from the following detailed description and appended claims taken in connection with the accompanying drawing.

DISCLOSURE OF THE INVENTION

We have made extensive and intensive studies with a view toward attaining the foregoing objects. As a result, it has surprisingly been found that when a novel photocurable resin laminate comprising a photocurable resin layer having a specific viscosity, a specific thickness and a specific ultraviolet ray transmittance is laminated under pressure on both surfaces of a metal-clad insulating base board having small-diameter through-holes, the photocurable resin layer of the photocurable resin laminate intrudes locally into the inner side of the inner circumferential edge of the terminal opening of each of the small-diameter through-holes, so that when the photocurable resin layer is subsequently exposed to actinic radiation from both the front surface side and the back surface side of the base board, a resist layer capable of completely preventing permeation of an etching solution is formed extending from the circumferential edge of each of both terminal openings of each small-diameter through-hole along and over the inner wall of the through-hole, thereby enabling the production of desired small-diameter through-hole type printed circuit boards at a high productivity. We have now completed the present invention, based on this finding.

More specifically, in one aspect of the present invention, there is provided a photocurable resin laminate comprising a support and a photocurable resin layer disposed on one surface of the support, the photocurable resin layer having:

(a) a viscosity of from $10^4$ to $5 \times 10^5$ poises as measured at 90° C.;
(b) a thickness of from 30 to 150 μm; and
(c) an ultraviolet ray transmittance of from 40 to 95% with respect to ultraviolet rays having a wavelength of 365 nm.

In another aspect of the present invention, there is provided a photocurable resin laminate for use in producing a printed circuit board having a plurality of conductive through-holes, comprising a support and a photocurable resin layer disposed on one surface of the support, the photocurable resin layer having:

(a) a viscosity of from $10^4$ to $5 \times 10^5$ poises as measured at 90° C.;
(b) a thickness of from 30 to 150 μm; and
(c) an ultraviolet ray transmittance of from 40 to 95 % with respect to ultraviolet rays having a wavelength of 365 nm, the photocurable resin laminate being adaptable to being applied to both surfaces of a metal-clad insulating base board having on both surfaces thereof a metallic conductive layer and having a plurality of through-holes with their respective entire inner walls covered with a metallic conductive layer, so that both surfaces of said metal-clad insulating base board, which are inclusive of both terminal openings of each through-hole, are each covered with one surface of the photocurable resin layer remote from said support, followed by the steps of exposing the photocurable resin layer on each surface of the metal-clad insulating base board to ultraviolet radiation through a predetermined transmitting pattern to form a photocured resin latent image covering both terminal openings of each through-hole, subjecting each exposed resin layer to development with a developer to form an image of the photocured resin, and etching the metallic conductive layer on each surface of the metal-clad insulating base board in areas other than the image of the photocured resin as an etching resist.

The examination of cross-sectional photomicrographs and scanning electron photomicrographs of a resist layer obtained by laminating the photocurable resin laminate of the present invention under pressure on both surfaces of a metal-clad base board having small-diameter through-holes and exposing the laminated photocurable resin laminate to light from both the front surface side and the back surface side of the base board, followed by etching, shows that a photocured resin layer of the photocurable resin layer, which is formed to cover both terminal openings of each small-diameter through-hole, intrudes locally in the inner side of the entire inner circumferential edge of both terminal openings of each small-diameter through-hole and extends to a predetermined depth from the entire inner circumferential edge along and on the inner wall of the through-hole, in a state such that the resin layer adheres closely to the inner wall surface. Therefore, even in an area where the land for the terminal opening is not substantially formed due to a positional disagreement between the land pattern of the negative mask and the terminal opening of the through-hole, permeation of the etching solution into the through-hole can be prevented by the cured resin layer extending from the entire inner circumference edge of the terminal opening of the through-hole along and on the inner wall of the through-hole, which cured resin layer adheres closely to the inner wall surface of the through-hole, thereby obviating troubles which are frequently caused by the action of a permeated etching solution on the conductive layer on the inner wall of the through-hole. The manner of formation of such a resist for through-holes in the method of the present invention is fundamentally different from the manner of formation of a resist for through-holes by adhesion between the land on the surface of the base board and the photocurable resin layer in the conventional tenting method, and by this novel resist-forming method of the present invention, conductive small-diameter through-holes can be formed assuredly. The photocurable resin laminate of the present invention can also be used for producing a through-hole type printed circuit board by the conventional tenting method. In such a case as well, printed circuit boards can be produced in a production yield comparable to or higher than the production yield attained by using the conventional photocurable resin laminate.

The photocurable resin layer of the photocurable resin laminate of the present invention should have a viscosity of $10^4$ to $5 \times 10^5$ poises, preferably $5 \times 10^4$ to $2 \times 10^5$ poises, as measured at 90° C. As the viscosity increases, the property for the photocurable resin layer to intrude into the through-hole from the inner circumferential edge of the small-diameter through-hole onto the inner wall of the through-hole is decreased, and even if optimum laminating conditions are chosen, the superiority to the conventional tenting method is reduced. If the viscosity exceeds the upper limit, no substantial significant effect is exerted over the conventional tenting method. On the other hand, as the viscosity decreases, the photocurable resin layer can easily intrude into the small-diameter through-hole from the inner circumferential edge onto the inner wall of the through-hole. In this case, however, when the photocurable resin laminate is stored at room temperature, it is difficult for the photocurable resin layer to stably maintain a predetermined uniform thickness. If the viscosity is below the lower limit, a mass of the oozing resin is likely to be formed on both ends of a roll of the photocurable resin laminate wound in a roll form, so that it becomes substantially impossible to laminate the photocurable resin laminate stably on the base board. Moreover, if the viscosity is too low, the thickness of the photocurable resin layer covering the through-holes is likely to be uneven, so that the resin layer partially has too small a thickness to maintain a sufficient film strength, leading to a coverage failure of the through-hole, which causes permeation of an etching solution into the through-hole.

The photocurable resin layer of the photocurable resin laminate of the present invention should have a thickness of 30 to 150 μm, preferably 35 to 100 μm. When the thickness is less than 30 μm, not only is the photocurable resin layer covering the terminal opening of the through-hole likely to be swollen or broken at the time of development, but also the depth to which the photocurable resin layer intrudes into the through-hole from the circumferential edge onto the inner wall is not sufficient and the reliability as the resist is decreased. When the thickness is more than 150 μm, not only does it become difficult to manifest a practical sensitivity while maintaining an ultraviolet ray transmittance of ultraviolet rays having a wave-length of 365 nm (hereinafter frequently referred to as "365 nm ultraviolet ray transmittance") at a level of at least 40%, but also the resolution is lowered.

The 365 nm ultraviolet ray transmittance of the photocurable resin layer of the photocurable resin laminate of the present invention should be 40 to 95%, preferably 45 to 90%. When the 365 nm ultraviolet ray transmittance is lower than 40%, a portion of the photocurable resin layer which has intruded into the through-hole from the inner circumferential edge of both terminal openings of the through-hole onto the inner wall is not sufficiently cured, so that coverage failure is likely to occur with respect to the land-lacking through-holes. The reason for this is presumed to be as follows. When the photocurable resin layer on each surface of the metal-clad insulating base board is exposed to ultraviolet radiation through a predetermined transmitting pattern, ultraviolet rays are transmitted through a photocurable resin layer covering one terminal opening of the through-hole and then reach another photocurable resin layer which have intruded into the through-hole from the inner circumferential edge of the opposite terminal opening of the through-hole and onto the inner wall, so that both of the photocurable resin layers which have intruded into the through-hole from both the opposite terminal openings thereof, are completely cured. Accordingly, when the 365 nm ultraviolet ray transmittance is lower than 40%, the intensity of the ultraviolet rays reaching the inner side of the one-side terminal opening from the opposite-side terminal opening becomes weak and, therefore, curing of a portion of each photocurable resin layer which has intruded into the through-hole becomes insufficient. When the 365 nm ultraviolet ray transmittance is more than 95%, it becomes impossible to obtain a practical photocuring speed (that is, a practical ultraviolet ray sensitivity).

The photocurable resin composition used in the present invention comprises a binder composed of a vinyl homopolymer or a vinyl copolymer, a photopolymerizable monomer and a photopolymerization initiator as indispensable components. The photocurable resin composition can further comprise a dye, a coloring agent, a plasticizer, a radical polymerization inhibitor and the like, if desired.

As the vinyl compound used for the vinyl homopolymer or vinyl copolymer binder, there can be mentioned alkyl (meth)acrylates, such as methyl (meth)acrylate, ethyl (meth)acrylate and propyl (meth)acrylate, and benzyl (meth)acrylate, styrene, α-methylstyrene and acrylonitrile. When the development is carried out with a weakly alkaline aqueous solution, it is preferred that another vinyl compound having an acid group, such as a carboxyl group, a sulfonic acid group or a phosphoric acid group, be copolymerized with the above-mentioned vinyl compound in a ratio such that the resultant copolymer has an acid equivalent of from 100 to 600. A carboxyl group is preferably used as the acid group. Examples of vinyl compounds having a carboxyl group include (meth)acrylic acid (including a half ester), fumaric acid, maleic acid (including a half ester), cinnamic acid and itaconic acid.

The weight average molecular weight of the binder composed of a vinyl homopolymer or vinyl copolymer is preferably 20,000 to 300,000. The weight average molecular weight is determined, using a calibration curve of standard polystyrene, by gel permeation chromatography (GPC). The content of the binder in the photocurable resin layer is from 5 to 90% by weight, preferably from 30 to 70% by weight. The photocurable resin layer having a viscosity of $10^4$ to $5 \times 10^5$ as measured at 90° C. can be obtained by appropriately selecting the molecular weight and amount of the binder and/or using as a binder, a copolymer having a suitable composition.

The photocurable resin layer of the photocurable resin laminate of the present invention is developed with a liquid developer after the exposure to ultraviolet rays. An aqueous solution of an alkali, such as sodium carbonate, or an organic solvent, such as 1,1,1-trichloroethane, can be used as the liquid developer. In order to prevent environmental pollution, it is preferred that the photocurable resin layer of the photocurable laminate of the present invention be a photocurable resin layer which is insoluble or nondispersible in an aqueous alkali solution so that it can be developed with an aqueous alkali solution. From this viewpoint, a vinyl copolymer comprising a vinyl compound having an acid group as mentioned above and a vinyl compound having no acid group is preferably used as the binder.

With respect to the photopolymerizable monomer, an unsaturated compound having at least one terminal ethylenically unsaturated group is used. For example, products obtained by an addition reaction between an α,β-unsaturated carboxylic acid and a monohydric or polyhydric alcohol can be used. As specific examples thereof, there can be mentioned polyethylene glycol di(meth)acrylate (the number of recurring ethylene oxide units is 2 to 14), polypropylene glycol di(meth)acrylate (the number of recurring propylene oxide units is 2 to 14), trimethylolpropane di(meth)acrylate, trimethylolpropane tri(meth)acrylate, tetramethylolmethane tri(meth)acrylate, tetramethylolmethane tetra(meth)acrylate, tetraethylene glycol phenyl ether (meth)acrylate, diethylene glycol ethyl ether (meth)acrylate, 2,2-bis(4-methacryloxyphenyl)propane, 2,2-bis(4-methacryloxyphenyl)propane, 2,2-bis(4-methacryloxytetraethoxyphenyl)propane and 2,2-bis(4-methacryloxypentaethoxyphenyl)propane. In addition, urethane products of the reaction between polyvalent isocyanate compounds, such as hexamethylene diisocyanate and tolylene diisocyanate, and hydroxy acrylate compounds, such as 2-hydroxypropyl (meth)acrylate, can be mentioned.

Other examples of photopolymerizable monomers, include products obtained by an addition reaction between an $\alpha,\beta$-unsaturated carboxylic acid and a glycidyl group-containing compound, such as bisphenol A diglycidyl ether di(meth)acrylate and phenylglycidyl ether (meth)acrylate. There can also be mentioned an esterification product between a polycarboxylic acid, such as succinic anhydride, and a compound having a hydroxyl group and an ethylenically unsaturated group, such as $\beta$-hydroxyethyl (meth)acrylate.

The content of the photopolymerizable monomer in the photocurable resin layer is from 5 to 80% by weight, preferably from 20 to 55% by weight. By appropriately choosing the types of the above-mentioned binder and the photopolymerizable monomer and also choosing an appropriate ratio therebetween, the viscosity at 90° C. can be adjusted to $10^4$ to $5\times10^5$ poises.

The type of the initiator to be contained in the photocurable resin layer is not particularly critical. As preferable examples, there can be mentioned compounds represented by the following formula (I):

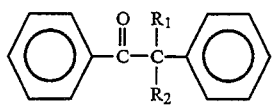

wherein $R_1$ and $R_2$ each independently represent a hydrogen atom, a hydroxyl group, an alkyl group, an alkoxy group or a phenoxy group, with the proviso that $R_1$ and $R_2$ simultaneously do not represent a hydroxyl group, such as benzyldimethyl ketal, benzyldiethyl ketal, benzyldipropyl ketal, benzyldiphenyl ketal, benzoin methyl ether, benzoin ethyl ether, benzoin propyl ether and benzoin phenyl ether, and compounds represented by the following formula (II):

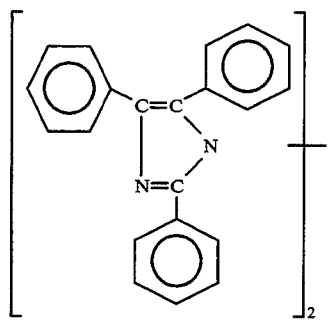

wherein the phenyl groups may be substituted, such as 2-(o-chlorophenyl)-4,5-diphenylimidazolyl dimer, 2-(o-fluorophenyl)-4,5-diphenylimidazolyl dimer, 2,4-di(p-methoxyphenyl)-5-phenylimidazolyl dimer and 2,4,5-triphenylimidazolyl dimer. These dimers are those of the 1,2'-bond.

These compounds (I) and (II) can be used individually, but preferably in combination.

An initiator having high photoinitiation capacity, such as benzophenone, a Michler's ketone or a thioxanthone, e.g., diethylthioxanthone, can be used in addition to the above-mentioned initiator. However, since this type of initiator exhibits high absorption for ultraviolet rays, this initiator, if used, should be incorporated in a small amount so that the 365 nm ultraviolet ray transmittance can be maintained at 40 to 95%. The content of the initiator in the photocurable resin layer is generally from 0.1 to 10% by weight. However, with respect to the initiator exhibiting high absorption for ultraviolet rays, such as a Michler's ketone or a thioxanthone, the content is preferably from 0.01 to 1% by weight.

A radical polymerization inhibitor is preferably incorporated for improving the thermal stability and storage stability of the photocurable resin layer. Examples of initiators include p-methoxyphenol, hydroquinone, pyrogallol, naphthylamine, tert-butylcatechol, cuprous chloride, 2,6-di-tert-butyl-p-cresol, 2,2'-methylene-bis(4-ethyl-6-tert-butylphenol), and 2,2'-methylene-bis(2-methyl-6-tert-butylphenol). When a radical polymerization inhibitor is added to the photocurable resin composition, it is preferred to incorporate an amount of 0.001 to 0.05% by weight, based on the weight of the composition.

A coloring agent, such as a dye or a pigment, can be incorporated in the photocurable resin layer used in the present invention. Examples of coloring agents include Fuchsine, Auramine base, Chalcoxide Green S, Para Magenta, Crystal Violet, Methyl Orange, Nile Blue 2B, Victoria Blue, Malachite Green, Basic Blue 20 and Diamond Green.

A color developer, for example, a luminous dye capable of developing a color under irradiation with light, can be incorporated into the photocurable resin layer in order to distinguish photocured areas from uncured areas. A combination of a leuco dye and a halogen compound is known as a representative example of a luminous dye. As the leuco dye, there can be mentioned, for example, Leuco Crystal Violet and Leuco Malachite Green. As the halogen compound, there can be mentioned amyl bromide, isoamyl bromide, isobutylene bromide, ethylene bromide, diphenylmethyl bromide, benzal bromide, methylene bromide, tribromomethylphenylsulfone, carbon tetrabromide, tris(2,3-dibromopropyl)phosphate, trichloroacetamide, amyl iodide, isobutyl iodide, 1,1,1-trichloro-2,2-bis(p-chlorophenyl) ethane and hexachloroethane.

Additives, such as a plasticizer, can be incorporated in the photocurable resin composition, if desired.

As well-known in the art, these coloring agents, color developer and plasticizers are added in such small amounts as will not spoil the desired properties of the photocurable resin layer used in the present invention.

As the support for the photocurable resin layer, a transparent support capable of transmitting ultraviolet rays as actinic rays is preferably used. A support incapable of transmitting ultraviolet rays can also be used. However, this non-transmitting support should be removed before the step of light exposure.

As the actinic ray-transmitting support, there can be mentioned a polyethylene terephthalate film, a polyvinyl alcohol film, a polyvinyl chloride film, a vinyl chloride copolymer film, a polyvinylidene chloride film, a vinylidene chloride copolymer film, a polymethyl methacrylate film, a methyl methacrylate copolymer film, a polystyrene film, a polyacrylonitrile film, a styrene copolymer film, a polyamide film and a cellulose derivative film.

A protective film can be laminated on a surface of the photosensitive resin layer, on a side remote from the support, of the photocurable resin laminate of the present invention. When the photocurable resin laminate is laminated on a metal-clad insulating base board, this protective film should be removed by peeling. Accordingly, the adherence of the protective layer to the photocurable resin layer should be smaller than the adherence of the support to the photocurable resin layer so that the protective layer can be easily peeled. For example, a polyethylene film and a polypropylene film can be used. A film having excellent peelability, which is disclosed in Japanese Patent Application Laid-Open Specification No. 59-202457, can advantageously be used.

Using the photocurable resin laminate of the present invention, a printed circuit board having small-diameter through-holes can advantageously be produced. That is, using an apparatus customarily used in the conventional tenting method, the photocurable resin laminate of the present invention is applied to both surfaces of a metal-clad insulating base board having on both surfaces thereof a metallic conductive layer and having a plurality of through-holes with their respective entire inner walls covered with a metallic conductive layer, so that both surfaces of said metal-clad insulating base board, which are inclusive of both terminal openings of each through-hole, are each covered with one surface of the photocurable resin layer remote from said support, and then subjected to light exposure, development and etching, thereby obtaining a printed circuit board having no breakage on the conductor layer formed on the inner circumferential edges and inner walls of the small-diameter through-holes, at high efficiency.

Therefore, in still another aspect of the present invention, there is provided a method for producing a printed circuit board, which comprises the steps of:

(1) providing a metal-clad insulating base board having on both surfaces thereof a metallic conductive layer and having a plurality of through-holes with their respective entire inner walls covered with a metallic conductive layer, said through-holes containing at least one through-hole having a diameter of not greater than 0.5 mm;

(2) applying to both surfaces of said metal-clad insulating base board a photocurable resin laminate comprising a support and a photocurable resin layer disposed on one surface of said support, so that both surfaces of said metal-clad insulating base board, which are inclusive of both terminal openings of each through-hole, are each covered with one surface of the photocurable resin layer remote from said support, said photocurable resin layer having:
(a) a viscosity of from $10^4$ to $5 \times 10^5$ poises as measured at 90° C.;
(b) a thickness of from 30 to 150 μm; and
(c) an ultraviolet ray transmittance of from 40 to 95% with respect to ultraviolet rays having a wavelength of 365 nm, wherein the application of said photocurable resin laminate to both surfaces of the metal-clad insulating base board is conducted under pressure so that a portion of said photocurable resin layer remote from said support intrudes locally in the inner side of the inner circumferential edge of both terminal openings of each through-hole and extends from said inner circumferential edge of the terminal opening along and on the inner wall of said through-hole to a predetermined depth;

(3) exposing the photocurable resin layer on each surface of the metal-clad insulating base board to ultraviolet radiation through a predetermined transmitting pattern to form a photocured resin latent image covering both terminal openings of each through-hole;

(4) subjecting the exposed resin layer on each surface of the metal-clad insulating base board to development with a developer to form an image of the photocured resin; and (5) etching the metallic conductive layer on each surface of the metal-clad insulating base board in areas other than the image of the photocured resin as an etching resist.

In the method of the present invention, the preparation of a metal-clad insulating base board in step (1), the light exposure in step (3), the development in step (4) and the etching operation in step (5) can be performed according to processes known in the art. With respect to these known processes, reference can be made to, for example, the specification of U.S. Pat. No. 4,360,582.

In step (2), the photocurable resin laminate of the present invention is applied under pressure to both surfaces of the metal-clad insulating base board, so that a portion of the photocurable resin layer, remote from the support, is caused to intrude locally into the inner side of the inner circumferential edge of both terminal openings of each through-hole and extends from the inner circumferential edge of the terminal opening along and on the inner wall of the through-hole to a predetermined depth. When the photocurable resin laminate-covered base board is exposed to ultraviolet radiation through a predetermined pattern from both surfaces (simultaneously or independently), the portion of the photocurable resin layer extending from the inner circumferential edge of both terminal openings of each through-hole along and on the inner wall thereof is exposed to ultraviolet radiation from both sides, so that the photocurable resin layer adheres closely to the inner circumferential edge and inner wall of each through-hole, thereby enabling the terminal openings of the through-holes to be perfectly covered without coverage failure.

In this step, it is preferred that the predetermined depth to which the resin layer extends along and on the inner wall of the through-hole from the inner circumferential edge of each terminal opening be not smaller than 0.3, more advantageously not smaller than 0.5, in terms of an index n, which is defined as a ratio of the depth to the thickness of metallic conductive layer on each surface of the metal-clad insulating base board. It is especially preferred that the depth be not smaller than 1.1 in terms of the index n.

A larger depth of the resin layer in the through-hole, expressed in terms of the index n, is preferable because coverage failure of the terminal opening is more effectively prevented even if the degree of the positional disagreement between the land pattern of the negative mask and a desired land portion for the terminal opening of the through-hole (the magnitude of this positional disagreement is hereinafter frequently referred to as "deviation width") is large. However, when the depth is larger than 2 in terms of the index n, not only is no further increase of the desired effect obtained, but also the time required for peeling the cured resin layer after etching becomes long so that the productivity is lowered. If the depth expressed in terms of the index n is smaller than 0.3, no significant effect over the conventional tenting method is exerted.

FIG. 1 is an enlarged cross-sectional diagrammatic view illustrating the through-hole in which the photocurable resin layer intrudes and extends along and on the inner wall of the through-hole from the inner circumferential edge of the terminal opening thereof. In FIG. 1, reference numeral 1 represents an insulating base board, reference numeral 2 represents a conductor layer having a thickness of t, which is formed on both surfaces of the insulating base board, reference numeral 3 represents the through-hole, reference numeral 4 represents the photocurable resin layer laminated on both surfaces of the insulating base board, and character d represents the depth of the photocurable resin layer extending along and on the inner wall of the through-hole from the inner circumferential edge of the terminal opening thereof. The index n is represented by the following formula:

$$n = d(\mu m)/t(\mu m)$$

When the depth of the resin layer in the through-hole is not smaller than 1.1 in terms of the index n, perfect through-holes for a printed circuit board can be obtained with high reliability by conducting the etching in step (5) for a period of time which is greater than a minimum time required for removing the metallic conductive layer on each surface of the metal-clad insulating base board in areas other than the image of the photocured resin and is smaller than an n-fold value of said minimum time, where n has the same meaning as defined for the index n. This effect is especially high when the inner diameter of the through-holes is smaller than 0.5 mm.

In order to cause the photocurable resin layer 4 to intrude along and on the inner wall of the through-hole from the inner circumferential edge of the terminal opening of the through-hole as shown in FIG. 1, it is necessary to use a hot roll laminator and choose the roll temperature and pressure and the lamination speed of the laminator appropriately depending on conditions, such as the viscosity of the photocurable resin layer and the thickness of the insulating base board. In general, the intrusion depth of the photocurable resin layer can be effectively increased by elevating the roll temperature and pressure and increasing the lamination speed.

As mentioned hereinbefore, the larger the depth of intrusion of the photocurable resin layer into the through-hole on its inner wall, the larger the allowable deviation width. When this depth is too small, the allowable deviation width is decreased and no substantial effect over the conventional tenting method is attained. However, if the depth becomes too large, the time required for removing the used resist becomes long, thereby lowering the productivity.

Therefore, lamination conditions should be chosen so that an appropriate intrusion depth of the photocurable resin layer is obtained, taking into consideration the width of the deviation between the land pattern of the negative mask and a desired land for the terminal opening of the through-hole, which deviation occurs in the production line.

Generally, the hot roll laminator is so constructed that a pair of upper and lower heating rolls are pressed against each other by the action of two air cylinders disposed on both ends of the upper heating roll, respectively. By rotating the heating rolls at a predetermined speed, the photocurable resin laminate can be laminated on both surfaces of the insulating base board. The laminating pressure is adjusted by the air pressure of the air cylinders.

For example, the intended lamination can be accomplished by applying a resin laminate to a metal-clad insulating based board under a pressure of at least 3 kg per unit width (cm) of the surface of the base board by means of the hot roll laminator while maintaining the roll temperature at 70° to 200° C. Preferably, this pressing operation is carried out at least two times. For this purpose, a two-stage laminator comprising two sets of roll systems can be used, or there can be adopted a method in which the press-lamination is accomplished by passing an assembly through rolls repeatedly. Use of the two-stage laminator is especially preferable. The two-stage laminator is known (Japanese Patent Application Publication No. 63-7477) and has been widely used in the art. The force of the press-lamination can be calculated by the following equation:

$$F = \frac{\pi r^2 \times P}{2l}$$

wherein r represents the inner diameter (cm) of the air cylinder, P represents the air pressure (kg/cm²; gauge pressure) applied to the air cylinder, l represents the width of the fed based board, and F represents the force (kg/cm) of the press-lamination.

At a lower lamination speed, the intrusion of the resin layer is easier, but when the lamination speed is too low, a problem arises with regard to the productivity. Accordingly, an appropriate lamination speed must be chosen, taking into account other conditions. The lamination speed is preferably 0.5 to 2 m/min.

At a high lamination temperature, the intrusion of the resin layer is easier, but when the lamination temperature is too high, undesirable generation of vapors is likely to take place, so that it is difficult to maintain the function of the dry film. The lamination temperature is preferably 70° to 200° C.

Since the laminating operation is carried out under a higher pressure and at a higher temperature than in the conventional method, the roll diameter, length and material of the laminator should be appropriately selected.

The light exposure is carried out using ultraviolet radiation from a super-high pressure mercury lamp or the like through a mask. In the mask, areas corresponding to portions to be left as a circuit and a portion to be left as a cover for the terminal opening of the conductive through-hole are transparent and highly light-transmitting.

The development can generally be performed by spraying an aqueous solution of sodium carbonate having a concentration of about 1% in the case of an alkali development type dry film or spraying 1,1,1-trichloroethane in the case of an organic solvent development type dry film. The etching can be conducted directly after the development. Alternatively, after the development, irradiation with ultraviolet radiation can be performed again prior to etching.

The etching can be performed using a method suitable for the dry film used, for example, an acid-etching method and an alkali-etching method.

Removal of the photocured resin image after the etching is performed by spraying an aqueous solution of sodium hydroxide or potassium hydroxide having a concentration higher than that of the developing solution, for example, a concentration of about 3%, for the photocured resin layer of the alkali development type. In the case of the photocured resin layer of the organic solvent development type, removal is performed using an organic solvent having a larger dissolving force than that of the liquid developer. Dichloromethane is generally used.

BEST MODE FOR CARRYING OUT THE INVENTION

Figure 1:
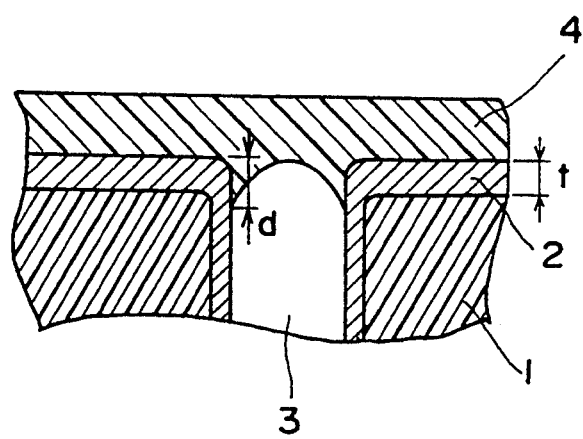
FIG. 1 is an enlarged cross-sectional diagrammatic view illustrating the through-hole in which the photocurable resin layer intrudes and extends along and on the inner wall of the through-hole from the inner circumferential edge of the terminal opening thereof.

The present invention will now be described in detail with reference to the following examples that by no means limit the scope of the invention.

In the examples, all "parts" are by weight.

The properties described in the examples were determined according to the following methods.

(1) Measurement of Viscosity

Using a flow tester (Model CFT-500 sold by Shimadzu Corporation, Japan), the constant-rate temperature-elevating test was carried out. The viscosity (VI) was determined by the following formula:

$$VI = \frac{\pi R^4 P}{8LQ} \text{ (poises)}$$

wherein P represents the applied pressure (dyne/cm$^2$), R represents the radius (mm) of the die, L represents the length (nun) of the die, and Q represents the flow value (ml/sec).

(2) Measurement of 365 nm Ultraviolet Ray Transmittance

In a UV spectrometer (Model UV-240 sold by Shimadzu Corporation, Japan), a laminate of a polyethylene terephthalate film and a photosensitive layer was placed on the measurement side while a polyethylene terephthalate film was placed on the reference side. The transmittance was continuously measured over the range of from 700 μm to 300 μm in the T% mode, and the value at 365 nm was read from the obtained chart.

(3) Evaluation of Cold Flow Characteristics

A 2.5 cm-square test piece was cut out from a photocurable resin laminate, and a protective film (polyethylene film) was peeled. The test piece with the protective film removed therefrom was held between a pair of 10 cm-square polyethylene terephthalate films at a center portion thereof, to which a force of 100 kg was then applied for 5 minutes by means of a hydraulic press heated at 40° C. The width of a photocurable resin composition portion protruded from the original size was measured in four directions and an average value thereof was calculated. The cold flow characteristics were evaluated according to the following criteria.

O: smaller than 0.5 mm
Δ: 0.5 to 0.8 mm
X: larger than 0.8 mm

Empirically, it has been found that when the laminate is stored in the form of a roll in an atmosphere maintained at 20° C, the following relationships are present between the above criteria of the cold flow characteristics and the period of time until it becomes substantially impossible to perform stable lamination of the laminate on a base board by means of a laminator due to the formation of a resin mass by solidification of the resin flowing out of both ends of the roll:

O: more than 4 months
Δ: 1 week to 4 months
x: less than 1 week (4) Measurement of Depth of Intrusion of Photosensitive Layer on Inner Wall of Through-Hole from Inner Circumferential Edge of Terminal Opening Thereof (hereinafter frequently referred to as "intrusion depth")

After the development, the board was embedded in an epoxy resin and the epoxy resin was cured. The cured product was cut by a diamond cutter and polished until the through-holes appear. Depth d in FIG. 1 was measured using an optical microscope.

(5) Determination of Opening Coverage Retention Ratio of Through-Hole

After the etching, the coverage of the terminal opening of the through-hole was observed by an optical microscope, and the presence or absence of breaks was checked and the opening coverage retention ratio was calculated by the following formula:

$$\text{opening coverage retention ratio} = \frac{\text{number of holes free of coverage failure}}{\text{number of observed holes}} \times 100$$

EXAMPLE 1

A solution having a composition described below was prepared.

140 parts of a 35% methyl ethyl ketone solution of a methyl methacrylate/methacrylic acid/n-butyl acrylate copolymer (weight ratio=65/27/8) having a weight average molecular weight of 80,000, (B-1);

30 parts of a urethane product of the reaction between hexamethylene diisocyanate and oligopropylene glycol monomethacrylate (PP-1000 sold by Nippon Yushi, Japan), (M-1);

10 parts of nonapropylene glycol diacrylate (M-2);

5 parts of benzyldimethylketal (I-1);

0.5 part of 2-(o-chlorophenyl)-4,5-diphenylimidazolyl dimer (I-2);

0.1 part of Malachite Green (D-1);

0.4 part of Leuco Crystal Violet (D-2);

0.4 part of tribromomethylphenylsulfone (D-3); and 8 parts of methyl ethyl ketone (MEK).

The solution having the above composition was uniformly coated on a polyethylene terephthalate film having a thickness of 25 μm by using a bar coater, and the coated film was dried for 5 minutes in a drier maintained at 90° C. to form a photocurable resin layer. The thickness of the photocurable resin layer (hereinafter frequently referred to as "photosensitive layer") was 50 μm. The viscosity of the photosensitive layer was 1.5×10$^5$ poises as measured at 90° C., and the 365 nm ultraviolet ray transmittance was 68%.

A polyethylene film having a thickness of 35 μm was laminated on the surface of the photosensitive layer remote from the polyethylene terephthalate film to obtain a photocurable resin laminate.

The photosensitive layer of the photocurable resin laminate was laminated at 120° C. on a copper-clad laminate board by means of a hot roll laminator (Model AL-70 sold by Asahi Kasei Kogyo K.K., Japan) while peeling the polyethylene film from the photocurable resin laminate. The formed laminate was pressed, using an air cylinder having an inner diameter of 4 cm, under a pressure of 5 kg/cm$^2$-gauge applied to the air cylinder. The lamination speed was adjusted to 1.0 m/min. As the copper-clad laminate board, those which respectively have thicknesses of 1.6 mm and 0.8 mm were used. The copper-clad laminate boards used were ones which were each prepared by cladding a copper foil having a thickness of 50 μm on both surfaces of a glass fiber-reinforced epoxy substrate having a width of 30 cm and a length of 20 cm, forming 1000 through-holes each having a diameter of 0.4 mm in the copper-clad base board and depositing copper in a thickness of 20 μm on the inner wall of the through-hole by plating to thereby obtain electric conduction between both surfaces of the resultant board.

The photosensitive layer was exposed to radiation of 100 mj/cm$^2$ using a super-high pressure mercury lamp (Model 201KB sold by Oak Seisakusho, Japan) through a negative film. The negative film has 1000 circular transmitting patterns each of a diameter of 0.45 mm, which transmitting patterns have been formed so as to be in registry with the through-holes. In this step of light exposure, the photosensitive layer on one surface of the board was light-exposed through the negative film placed so that each transmitting pattern (which corresponds to a mask for covering each through-hole and, is hereinafter frequently referred to as "mask") was staggered from each through-hole by a deviation width of 100 μm or 20 μm, whereas the photosensitive layer on the other surface of the board through the negative film placed so that each mask is not staggered from each through-hole. With respect to the mask-staggered surface, the magnitude of the deviation between the circumference of the circular transmitting pattern of the negative film and the circumference of the terminal opening (which is circular in cross-section) of the through-hole was measured on a line passing through the respective centers of the circular transmitting pattern and the circular terminal opening of the through-hole and on the side where the nontransmitting pattern of the negative film partially overlapped the terminal opening of the through-hole. The measured magnitude (width) of the deviation is designated as "mask deviation". Then, the polyethylene terephthalate film was peeled, and a 1% aqueous solution of sodium carbonate was sprayed for about 70 seconds to remove an unexposed area by dissolution, to thereby obtain an excellent cured resin image. When the sensitivity was measured using Kodak 21-stage step tablet, it was found that the cured resin film remained to the 7th stage. The above-obtained board was subjected to etching with a cupric chloride etching solution. The required minimum etching time was 100 seconds, and therefore, the etching time was adjusted to 120 seconds. The cured resin film used as the resist was removed by spraying a 3% aqueous solution of sodium hydroxide at 50° C. for 120 seconds, and the conduction in the through-holes was examined using a tester. In the case where the 1.6 mm-thick copper-clad base board was used and the light exposure was conducted through the negative film placed with the 100 μm mask deviation, through-hole conduction breakage was caused at 10 through-holes (1.0%), whereas in the case where the mask deviation was 20 μm, no through-hole conduction breakage was caused at any through-hole (0.0%). When the board thickness was 1.6 mm and the mask deviation was 20 μm, the retention ratio of the coverage of the opening of the through-hole (hereinafter frequently referred to simply as "opening coverage") was 100%, and coverage failure was not found at all.

EXAMPLES 2 THROUGH 5 AND COMPARATIVE EXAMPLES 1 THROUGH 8

Substantially the same procedure as in Example 1 was repeated except that compositions indicated in Table 1 were individually used. The obtained results are shown in Table 1.

The abbreviations indicated in Table 1 are the same as in Example 1 or as describe below. M-3: A reaction product between a half-ester of phthalic anhydride with 2-hydroxypropyl acylate and propylene oxide, (OE-A200 sold by Nippon Shokubai Kagaku, Japan) represented by the following formula:

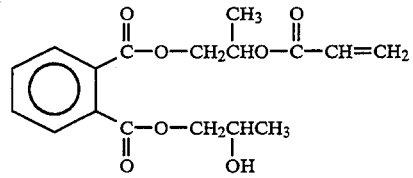

B-2: A 35% methyl ethyl ketone solution of a methyl methacrylate/methacrylic acid/n-butyl acrylate/styrene copolymer (40/25/10/25 weight ratio) having a weight average molecular weight of 70,000.

B-3: A 30% methyl ethyl ketone solution of a copolymer having a same monomer composition as that of B-1 but having a weight average molecular weight of 125,000.

B-4: A 40% methyl ethyl ketone solution of a copolymer having the same monomer composition as that of B-1 but having a weight average molecular weight of 25,000.

I-3: Benzophenone
I-4: Michler's ketone

TABLE 1

|  | Example 1 | Example 2 | Example 3 | Example 4 | Example 5 |
| --- | --- | --- | --- | --- | --- |
| Composition | B-1(140) | B-2(155) | B-1(140) | B-2(155) | B-1(148) |
| (parenthesized value | M-1(30) | M-1(30) | M-1(30) | M-1(30) | M-1(24) |
| indicates parts by weight) | M-2(10) | M-2(10) | M-2(10) | M-2(10) | M-2(10) |
|  | I-1(5) | I-1(5) | I-1(3) | I-1(5) | M-3(8) |
|  | I-2(0.5) | I-2(0.5) | I-2(0.5) | I-2(0.5) | I-1(4) |
|  | D-1(0.1) | D-1(0.1) | D-1(0.1) | D-1(0.1) | I-2(0.5) |
|  | D-2(0.4) | D-2(0.4) | D-2(0.4) | D-2(0.4) | D-1(0.1) |
|  | D-3(0.4) | D-3(0.4) | D-3(0.4) | D-3(0.4) | D-2(0.4) |
|  | MEK(8) | MEK(8) | MEK(8) | MEK(8) | D-3(0.4) |
|  |  |  |  |  | MEK(8) |
| Viscosity (poises), 90° C. | $1.5 \times 10^5$ | $7.0 \times 10^4$ | $1.0 \times 10^5$ | $8.5 \times 10^4$ | $1.5 \times 10^5$ |
| Film thickness (μm) | 50 | 50 | 80 | 80 | 50 |
| UV Transmittance (365 nm) | 68 | 60 | 48 | 45 | 70 |

TABLE 1-continued

|  |  |  |  |  |  |
|---|---|---|---|---|---|
| Sensitivity (100 mj/cm², Kodak 21-stage step tablet) | 7 | 7 | 7 | 8 | 7 |
| Intrusion Depth (d) (μm) | 35 | 40 | 45 | 45 | 40 |
| Through-hole conduction breakage ratio (%) |  |  |  |  |  |
| Board thickness, 1.6 mm |  |  |  |  |  |
| Mask deviation, |  |  |  |  |  |
| 100 μm | 1.0 | 0.4 | 1.0 | 1.2 | 0.7 |
| 20 μm | 0 | 0 | 0 | 0.2 | 0 |
| Board thickness, 0.8 mm Mask deviation, 20 μm | 0 | — | — | — | — |
| Opening coverage retention ratio (%) (board thickness = 1.6 mm, mask deviation = 20 μm) | 100 | 100 | 100 | 100 | 100 |
| Cold flow characteristics | ○ | Δ | ○ | Δ | ○ |

|  | Comparative Example 1 | Comparative Example 2 | Comparative Example 3 | Comparative Example 4 | Comparative Example 5 |
|---|---|---|---|---|---|
| Composition (parenthesized value indicates parts by weight) | B-3(167) M-1(30) M-2(10) I-1(5) I-2(0.5) D-1(0.1) D-2(0.4) D-3(0.4) MEK(8) | B-3(190) M-1(25) M-2(5) I-1(5) I-2(0.5) D-1(0.1) D-2(0.4) D-3(0.4) MEK(8) | B-1(140) M-1(30) M-2(10) I-3(4) I-4(0.1) D-1(0.1) D-2(0.4) D-3(0.4) MEK(8) | B-1(140) M-1(30) M-2(10) I-1(0.5) D-1(0.1) D-2(0.4) D-3(0.4) MEK(8) | B-1(140) M-1(30) M-2(10) I-1(7) I-2(3.5) D-1(0.1) D-2(0.4) D-3(0.4) MEK(8) |
| Viscosity (poises), 90° C. | 6 × 10⁵ | 5 × 10⁶ | 1.5 × 10⁵ | 1.7 × 10⁵ | 1.3 × 10⁵ |
| Film thickness (μm) | 50 | 50 | 50 | 40 | 50 |
| UV Transmittance (365 nm) | 70 | 70 | 6 | 96 | 35 |
| Sensitivity (100 mj/cm², Kodak 21-stage step tablet) | 7 | 7 | 7 | 0 | 10 |
| Intrusion Depth (d) (μm) | 10 | 5 | 37 | 30 | 35 |
| Through-hole conduction breakage ratio (%) |  |  |  |  |  |
| Board thickness, 1.6 mm |  |  |  |  |  |
| Mask deviation, |  |  |  |  |  |
| 100 μm | 8 | 15 | 26 | 100 | 13 |
| 20 μm | 3 | 5 | 4 | 90 | 2 |
| Board thickness, 0.8 mm Mask deviation, 20 μm | 2 | — | — | — | — |
| Opening coverage retention ratio (%) (board thickness = 1.6 mm, mask deviation = 20 μm) | 10 | 0 | 0 | 0 | 50 |
| Cold flow characteristics | ○ | ○ | ○ | ○ | ○ |

|  | Comparative Example 6 | Comparative Example 7 | Comparative Example 8 |
|---|---|---|---|
| Composition (parenthesized value indicates parts by weight) | B-1(140) M-1(30) M-2(10) I-1(5) I-2(0.5) D-1(0.1) D-2(0.4) D-3(0.4) MEK(8) | B-1(140) M-1(30) M-2(10) I-1(2) I-2(0.5) D-1(0.1) D-2(0.4) D-3(0.4) MEK(8) | B-4(143) M-1(25) M-2(8) I-1(5) I-2(0.5) D-1(0.1) D-2(0.4) D-3(0.4) |
| Viscosity (poises), 90° C. | 1.5 × 10⁵ | 1.7 × 10⁵ | 5 × 10³ |
| Film thickness (μm) | 25 | 170 | 50 |
| UV Transmittance (365 nm) | 80 | 50 | 70 |
| Sensitivity (100 mj/cm², Kodak 21-stage step tablet) | 7 | 2 | 5 |
| Intrusion Depth (d) (μm) | 15 | 45 | 10 |
| Through-hole conduction breakage ratio (%) |  |  |  |
| Board thickness, 1.6 mm |  |  |  |
| Mask deviation, |  |  |  |

TABLE 1-continued

| | | | |
|---|---|---|---|
| 100 μm | 52 | 9 | 5 |
| 20 μm | 5 | 0.4 | 1 |
| Board thickness, 0.8 mm Mask deviation, 20 μm | — | — | 12 |
| Opening coverage retention ratio (%) (board thickness = 1.6 mm, mask deviation = 20 μm | 40 | 50 | 70 |
| Cold flow characteristics | ○ | ○ | X |

COMPARATIVE EXAMPLE 9

A solution having a composition described below was prepared.

35.5 parts of a styrene/monobutyl maleate copolymer (having a weight average molecular weight of 20,000 and an acid value of 180):
25.5 parts of a styrene/acrylic acid copolymer (75/25 weight ratio) (having a weight average molecular weight of 7,000);
28.0 parts of trimethylolpropane triacrylate;
3.0 parts of tetraethylene glycol diacrylate;
7.5 parts of benzoin methyl ether;
2.0 parts of I-2;
0.4 part of benzotriazole;
0.4 part of D-2;
0.1 part of D-1; and
100 parts of MEK.

A photosensitive layer was prepared in the same manner as described in Example 1 by using a solution having the above-mentioned composition. The thickness of the photosensitive layer was 50 μm, and the viscosity was $1\times10^5$ poises as measured at 90° C., and the 365 nm ultraviolet ray transmittance was 60%. A photocurable resin laminate was prepared in the same manner as described in Example 1. The following evaluations were made in the same manner as described in Example 1 (where the thickness of the base board was 1.6 mm). The sensitivity was evaluated as the 7th step by the test using Kodak 21-stage step tablet, and the through-hole conduction breakage ratio was 8% (where the mask deviation was 100 μm).

EXAMPLE 6

A solution having a composition described below was prepared.

50 parts of a methyl methacrylate/methyl acrylate copolymer (98/2 weight ratio) having a weight average molecular weight of 200,000;
13 parts of a urethane product of the reaction between hexamethylene diisocyanate and 2-hydroxypropyl acrylate;
13 parts of trimethylolpropane triacrylate;
13 parts of tetraethylene glycol diacrylate;
5 parts of I-1;
0.5 part of I-2;
0.1 part of D-1;
0.4 part of D-2;
0.5 part of D-3;
6 parts of p-toluenesulfonamide; and
140 parts of methyl ethyl ketone.

A photosensitive layer was prepared in the same manner as described in Example 1 by using a solution having the above-mentioned composition. The thickness of the photosensitive layer was 50 μm and the viscosity was $1.3\times10^5$ poises as measured at 90° C., and the 365 nm ultraviolet ray transmittance was 67%.

A photocurable resin laminate was prepared in the same manner as described in Example 1. The following evaluations were made (where the thickness of the base board was 1.6 mm) in the same manner as described in Example 1 except that 1,1,1-trichloroethane was sprayed for 100 seconds for the dissolution of the unexposed area. The sensitivity was evaluated as the 7th step by the test using Kodak 21-stage step tablet and the through-hole conduction breakage ratio (where the mask deviation was 100 μm) was 0.8%.

COMPARATIVE EXAMPLE 10

A solution having a composition as described below was prepared.

65 parts of polymethyl methacrylate (having a weight average molecular weight of 100,000);
20 parts of M-3;
5 parts of benzoin methyl ether;
0.2 part of D-2;
0.5 part of D-3;
8 parts of triethylene glycol diacetate;
0.5 part of p-methoxyphenol; and
100 parts of MEK.

A photosensitive layer was prepared in the same manner as described in Example 1by using a solution having the above-mentioned composition. The thickness of the photosensitive layer was 50 μm and the viscosity was $1\times10^7$ poises as measured at 90° C. and the 365 nm ultraviolet ray transmittance was 60%.

A photocurable resin laminate was prepared in the same manner as described in Example 1, and the following evaluations were made in the same manner as described in Example 6. The sensitivity was evaluated as the 6th step by the test using Kodak 21-stage step tablet, and the through-hole conduction breakage ratio (where the mask deviation was 100 μm) was 37%.

EXAMPLES 7 THROUGH 9 AND COMPARATIVE EXAMPLE 11 THROUGH 13

The following solutions A and B were prepared.
Solution A: the same composition as in Example 1.
Solution B: 0.06 part of Diamond Green was used instead of D-1in the solution of Comparative Example 2.

Photocurable resin laminates were individually prepared in the same manner as described in Example 1 by using these solutions A and B. The thickness of the photosensitive layer of each laminate was 50 μm.

The performance evaluation test was carried out in the same manner as described in Example 1by using a two-stage laminator (Model AL-700 sold by Asahi Kasei Kogyo K.K., Japan). The lamination speed was adjusted to 0.5 m/min. The press-laminating force applied per unit width (cm) of the surface of the base board was changed by changing the pressure. The test results are shown in Table 2.

TABLE 2

|  | Example 7 | Example 8 | Example 9 | Comparative Example 11 | Comparative Example 12 | Comparative Example 13 |
| --- | --- | --- | --- | --- | --- | --- |
| Solution | A | A | A | B | A | A |
| Lamination method, Temperature (°C.) (former stage/latter stage) | one-stage method, 120 | two-stage method, 120/140 | two-stage method, 120/140 | two-stage method, 120/140 | one-stage method, 120 | two-stage method, 120/140 |
| Press-laminating force (kg) per cm of width of base board | 6.0 | 4.5 | 5.5 | 5.5 | 2.0 | 2.0 |
| Intrusion depth (d) (μm) | 60 | 80 | 92 | 86 | 10 | 22 |
| Opening coverage retention ratio*[1] (%) | 56 | 95 | 100 | 0 | 0 | 5 |
| n | 1.2 | 1.6 | 1.8 | 1.7 | 0.2 | 0.4 |
| Etching time/minimum etching time*[2] | 1.1 | 1.2 | 1.2 | 1.2 | 1.2 | 1.2 |

Note
*[1] mask deviation = 100 μm
*[2] required minimum etching time = 100 seconds

Industrial Applicability.

When the novel photocurable resin laminate of the present invention is laminated under pressure on both surfaces of a metal-clad insulting base board having small-diameter through-holes and the ultraviolet radiation exposure and the subsequent development with a liquid developer are carried out, a photocurable resin layer adhering closely to the inner wall of each small-diameter through-hole from the inner circumferential edge of both terminal openings of the through-hole is formed in each through-hole, thereby obtaining sufficient coverage of each terminal opening of the through-hole without occurrence of coverage failure. The danger of permeation of an etching solution into the through-holes in the subsequent etching step can be completely eliminated. Accordingly, excellent electric conduction can be obtained between both surfaces of the printed circuit board, with high reliability. Therefore, this novel photocurable resin laminate can advantageously be utilized for the production of printed circuit boards having small-diameter through-holes, the demand for which is now increasing.

We claim:

1. A method for producing a printed circuit board, which comprises the steps of:
   (1) providing a metal-clad insulating base board having on both surfaces thereof a metallic conductive layer and having a plurality of through-holes with their respective entire inner walls covered with a metallic conductive layer, said through-holes containing at least one through-hole having a diameter of not greater than 0.5 mm;
   (2) applying to both surfaces of said metal-clad insulating base board a photocurable resin laminate comprising a support and a photocurable resin layer disposed on one surface of said support, so that both surfaces of said metal-clad insulating base board, which are inclusive of both terminal openings of each through-hole, are each covered with one surface of the photocurable resin layer remote from said support,
   said photocurable resin layer having:
   (a) a viscosity of from $10^4$ to $5 \times 10^5$ poises as measured at 90° C.;
   (b) a thickness of from 30 to 150 μm; and
   (c) an ultraviolet ray transmittance of from 40 to 95% with respect to ultraviolet rays having a wave-length of 365 nm,
   wherein the application of said photocurable resin laminate to both surfaces of the metal-clad insulating base board is conducted under pressure so that a portion of said photocurable resin layer remote from said support intrudes locally in the inner side of each of the inner circumferential edges of both terminal openings of each through-hole and extends from said inner circumferential edge of each terminal opening along and on the inner wall of said through-hole to a depth which is not smaller than 0.3 in terms of an index n, which is defined as a ratio of said depth to the thickness of the metallic conductive layer on each surface of the metal-clad insulating base board;
   (3) exposing the photocurable resin layer on each surface of the metal-clad insulating base board to ultraviolet radiation through a predetermined transmitting pattern to form an exposed resin layer containing a photocured resin latent image covering both terminal openings of each through-hole;
   (4) subjecting the exposed resin layer on each surface of the metal-clad insulating base board to development with a developer to form an image of the photocured resin corresponding to said photocured resin latent image; and
   (5) etching the metallic conductive layer on each surface of the metal-clad insulating base board in areas other than the image of the photocured resin as an etching resist.

2. The method according to claim 1, wherein said depth is not smaller than 0.5 in terms of the index n.

3. The method according to claim 2, wherein said depth is not smaller than 1.1 in terms of the index n and wherein the etching in step (5) is conducted for a period of time which is greater than a minimum time required for removing the metallic conductive layer on each surface of the metal-clad insulating base board in areas other than the image of the photocured resin and is smaller than an n-fold value of said minimum time, where n has the same meaning as defined for the index n.

4. The method according to claim 1 or 2, wherein said photocurable resin layer is insoluble or non-dispersible in water and soluble or dispersible in an aqueous alkali solution.

5. The method according to claim 4, wherein said photocurable resin layer comprises a vinyl copolymer, a photopolymerizable monomer and a photopolymerization initiator.

6. The method according to claim 1, which is for producing a printed circuit board in which said through-hole having a diameter of not greater than 0.5 mm has a conductor layer portion of a width of not greater than 100 μm around the terminal opening of said through-hole on the surface of said circuit board.

* * * * *

UNITED STATES PATENT AND TRADEMARK OFFICE
CERTIFICATE OF CORRECTION

PATENT NO. : 5,356,755
DATED : Oct. 18, 1994
INVENTOR(S) : Matsuda et al.

It is certified that error appears in the above-indentified patent and that said Letters Patent is hereby corrected as shown below:

At column 13, line 45, please change "700 µm to 300 µm" to read --700 nm to 300 nm--.

Signed and Sealed this

Seventh Day of January, 1997

*Attest:*

BRUCE LEHMAN

*Attesting Officer*   *Commissioner of Patents and Trademarks*